(12) United States Patent
Bunce et al.

(10) Patent No.: US 7,075,855 B1
(45) Date of Patent: Jul. 11, 2006

(54) MEMORY OUTPUT TIMING CONTROL CIRCUIT WITH MERGED FUNCTIONS

(75) Inventors: Paul A. Bunce, Poughkeepsie, NY (US); John D. Davis, Wallkill, NY (US); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/053,612

(22) Filed: Feb. 8, 2005

(51) Int. Cl.
*G11C 8/00* (2006.01)

(52) U.S. Cl. .................. 365/233; 365/189.04; 365/200

(58) Field of Classification Search ...................... None
See application file for complete search history.

(56) References Cited

U.S. PATENT DOCUMENTS

| | | | |
|---|---|---|---|
| 6,310,803 B1 * | 10/2001 | Hidaka | 365/200 |
| 6,331,956 B1 * | 12/2001 | Ooishi et al. | 365/200 |
| 6,349,072 B1 * | 2/2002 | Origasa et al. | 365/233 |
| 6,414,892 B1 * | 7/2002 | Furumochi | 365/210 |
| 6,657,886 B1 | 12/2003 | Adams et al. | 365/154 |
| 6,737,685 B1 | 5/2004 | Aipperspach et al. | 257/208 |
| 6,741,493 B1 | 5/2004 | Christensen et al. | 365/154 |
| 6,771,552 B1 * | 8/2004 | Fujisawa | 365/221 |
| 2005/0007813 A1 | 1/2005 | Adams et al. | 365/154 |

* cited by examiner

*Primary Examiner*—Son Mai
(74) *Attorney, Agent, or Firm*—Lynn Auspurger; Cantor Colburn LLP

(57) ABSTRACT

An output timing control circuit for use with a memory array. The output timing control circuit includes a redundancy decode circuit and a bit column output circuit. The bit column output circuit includes a first bit column output gate and a second bit column output gate, each bit column output gate is coupled to a bitline in the memory array. A precharge circuit is coupled to an output of the first bit column output gate and the second bit column output gate. The precharge circuit is responsive to a port enable signal. The redundancy decode circuit receives the port enable signal and a fuse signal and activates one of the first bit column output gate and the second bit column output gate.

18 Claims, 4 Drawing Sheets

MEMORY OUTPUT TIMING CONTROL CIRCUIT WITH MERGED FUNCTIONS

FIELD OF THE INVENTION

This invention relates to memory output circuits, and particularly to a memory output timing control circuit having merged functions.

BACKGROUND

FIGS. 1A and 1B illustrate a high performance, low power domino SRAM design including multiple local cell groups such as that shown in U.S. Pat. No. 6,657,886, the entire contents of which are incorporated herein by reference. As shown in FIG. 1A, each cell group includes multiple SRAM cells 1–N and local true and complement bitlines LBLT and LBLC. Each SRAM cell includes a pair of inverters that operate together in a loop to store true and complement (T and C) data. The local true bitline LBLT and the local complement bitline LBLC are connected to each SRAM cell by a pair of wordline N-channel field effect transistors (NFETs) to respective true and complement sides of the inverters. A WORDLINE provides the gate input to wordline NFETs. A particular WORDLINE is activated, turning on respective wordline NFETs to perform a read or write operation.

As shown in FIG. 1B, the prior art domino SRAM includes multiple local cell groups 1–M. Associated with each local cell group are precharge true and complement circuits coupled to the respective local true and complement bitlines LBLT and LBLC, write true and write complement circuits, and a local evaluate circuit. Each of the local evaluate circuits is coupled to a global bitline labeled 2ND STAGE EVAL and a second stage inverter that provides output data or is coupled to more stages. A write predriver circuit receiving input data and a write enable signal provides write true WRITE T and write complement WRITE C signals to the write true and write complement circuits of each local cell group.

A read occurs when a wordline is activated. Since true and complement (T and C) data is stored in the SRAM memory cell, either the precharged high true local bitline LBLT will be discharged if a zero was stored on the true side or the precharged high complement bitline LBLC will be discharged if a zero was stored on the complement side. The local bitline, LBLT or LBLC connected to the one side will remain in its high precharged state. If the true local bitline LBLT was discharged then the zero will propagate through one or more series of domino stages eventually to the output of the SRAM array. If the true local bitline was not discharged then no switching through the domino stages will occur and the precharged value will remain at the SRAM output.

To perform a write operation, the wordline is activated as in a read. Then either the write true WRITE T or write complement WRITE C signal is activated which pulls either the true or complement local bitline low via the respective write true circuit or write complement circuit while the other local bitline remains at its precharged level, thus updating the SRAM cell.

In a high speed domino bitline memory array, array read access time can vary widely depending on the strength of the cell device which discharges the bitline. As the wafer dimensions of these narrow devices get increasingly smaller, the process induced access variation continues to increase. In addition, when the array is written, the access time associated with the data driver switching the bitline can produce an even earlier effective read output of the array. Thus, there is a need in the art to generate an enable signal to control access timing to the array.

SUMMARY OF THE INVENTION

Embodiments of the invention include an output timing control circuit for use with a memory array. The output timing control circuit includes a redundancy decode circuit and a bit column output circuit. The bit column output circuit includes a first bit column output gate and a second bit column output gate, each bit column output gate is coupled to a bitline in the memory array. A precharge circuit is coupled to an output of the first bit column output gate and the second bit column output gate. The precharge circuit is responsive to a port enable signal. The redundancy decode circuit receives the port enable signal and a fuse signal and activates one of the first bit column output gate and the second bit column output gate. A memory including the output timing control circuit is also disclosed.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1A:
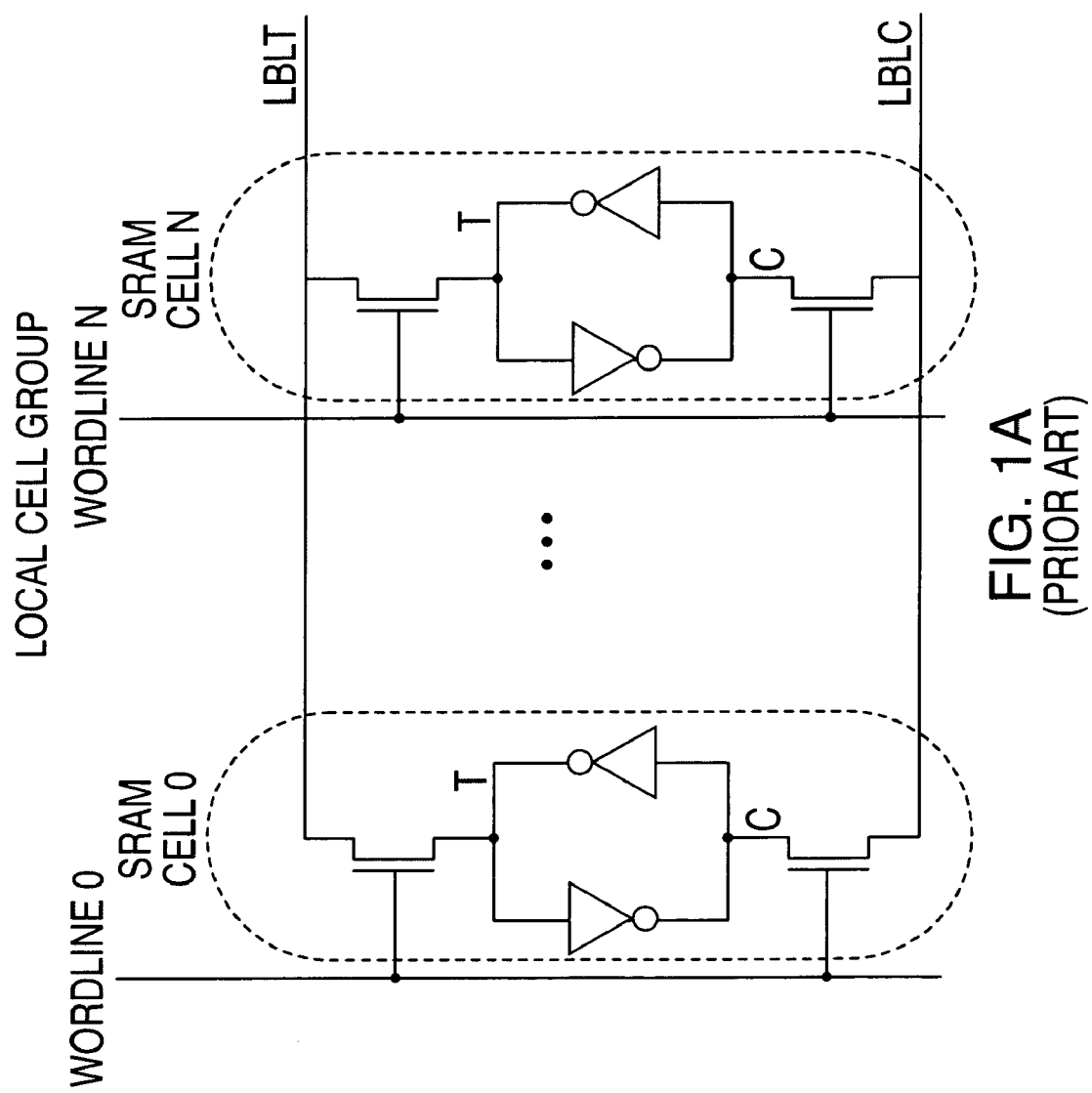
FIG. 1A illustrates an exemplary conventional SRAM cell.
Figure 1B:
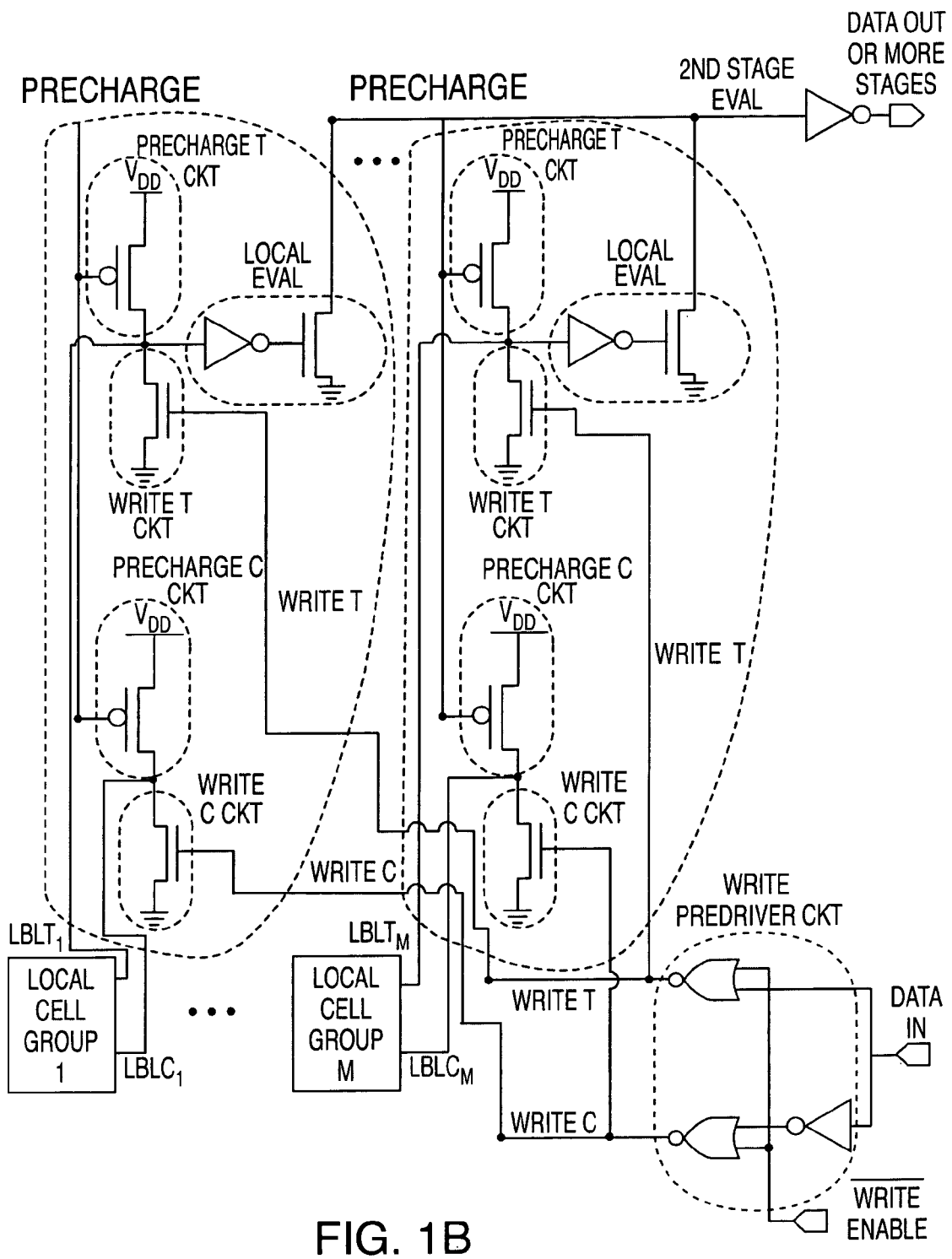
FIG. 1B illustrates an exemplary domino SRAM.
Figure 2:
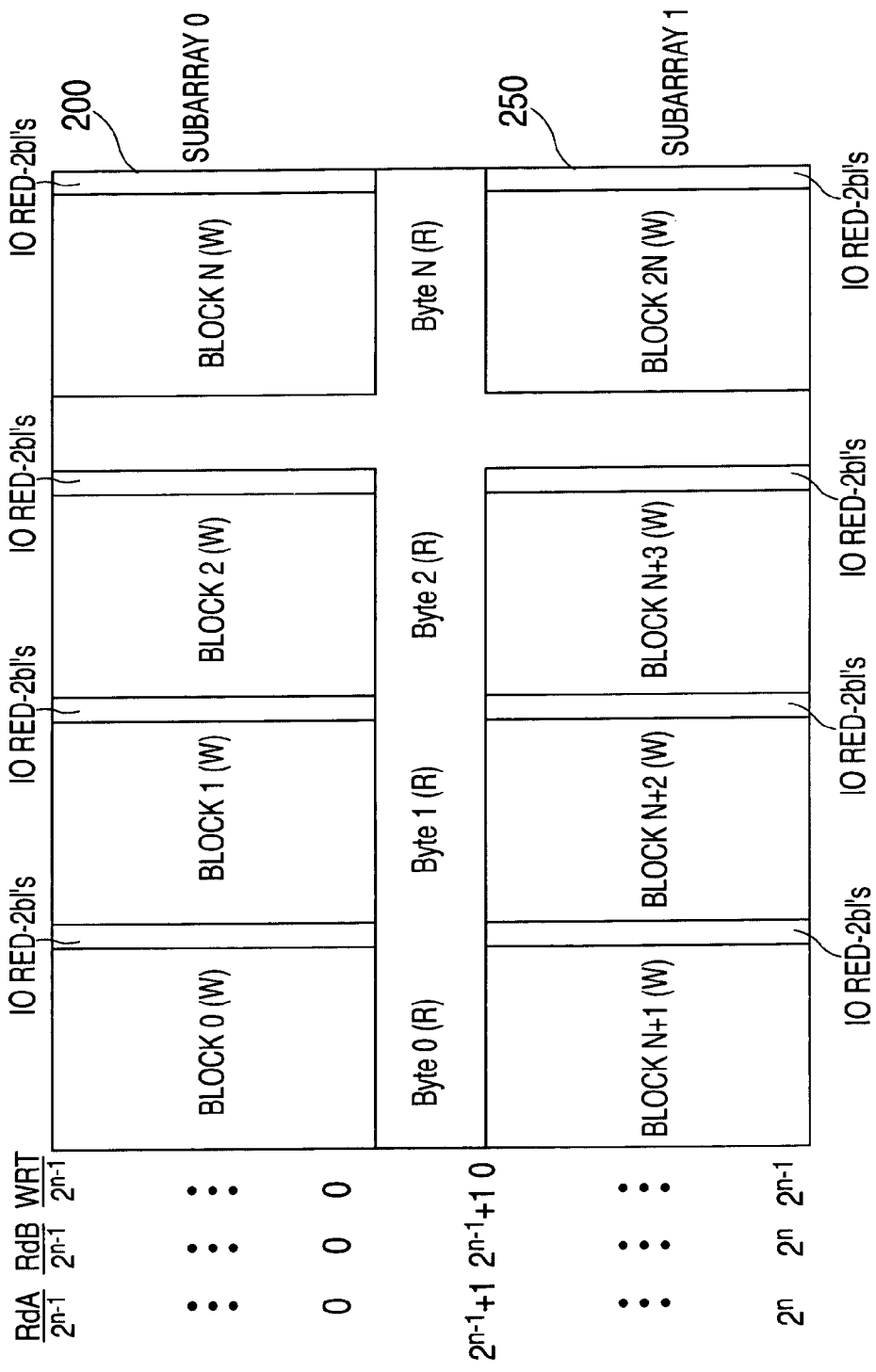
FIG. 2 illustrates an exemplary three port memory array.

FIG. 2 illustrates an exemplary three port memory array. The memory array is arranged in an upper sub-array 200 and a lower sub-array 250, each having a number SRAM cells as described with reference to FIGS. 1 and 2. The memory array may read from either sub-array through 2 ports, referenced as ports A and B. Each sub-array holds $2^{n-1}$ words. A read of the top sub-array is accomplished using addresses $0–2^{n-1}$. A read of the bottom sub-array is accomplished using addresses $2^{n-1}+1–2^n$. The two port read operation is depicted in FIG. 2 with the addresses in RdA and RdB columns.

For write operations, both sub-arrays 200 and 250 are accessed simultaneously using a write address ranging from $0–2^{n-1}$. This causes a write operation to be performed over all blocks across both sub-arrays 200 and 250. Thus, four access conditions are possible, top sub-array to port A, top sub-array to port B, bottom sub-array to port A and bottom sub-array to port B. Accessing either port from both top sub-array and bottom sub-array simultaneously would cause a collision in data at the output latch. Thus, it is necessary to block the data coming from either the upper sub-array or the lower sub-array. As described in further detail herein, data steering is used in the output timing control circuit to direct the read output of a write operation to port A or B. The single port write operation is depicted in FIG. 2 with the addresses in WRT column.

Figure 3:
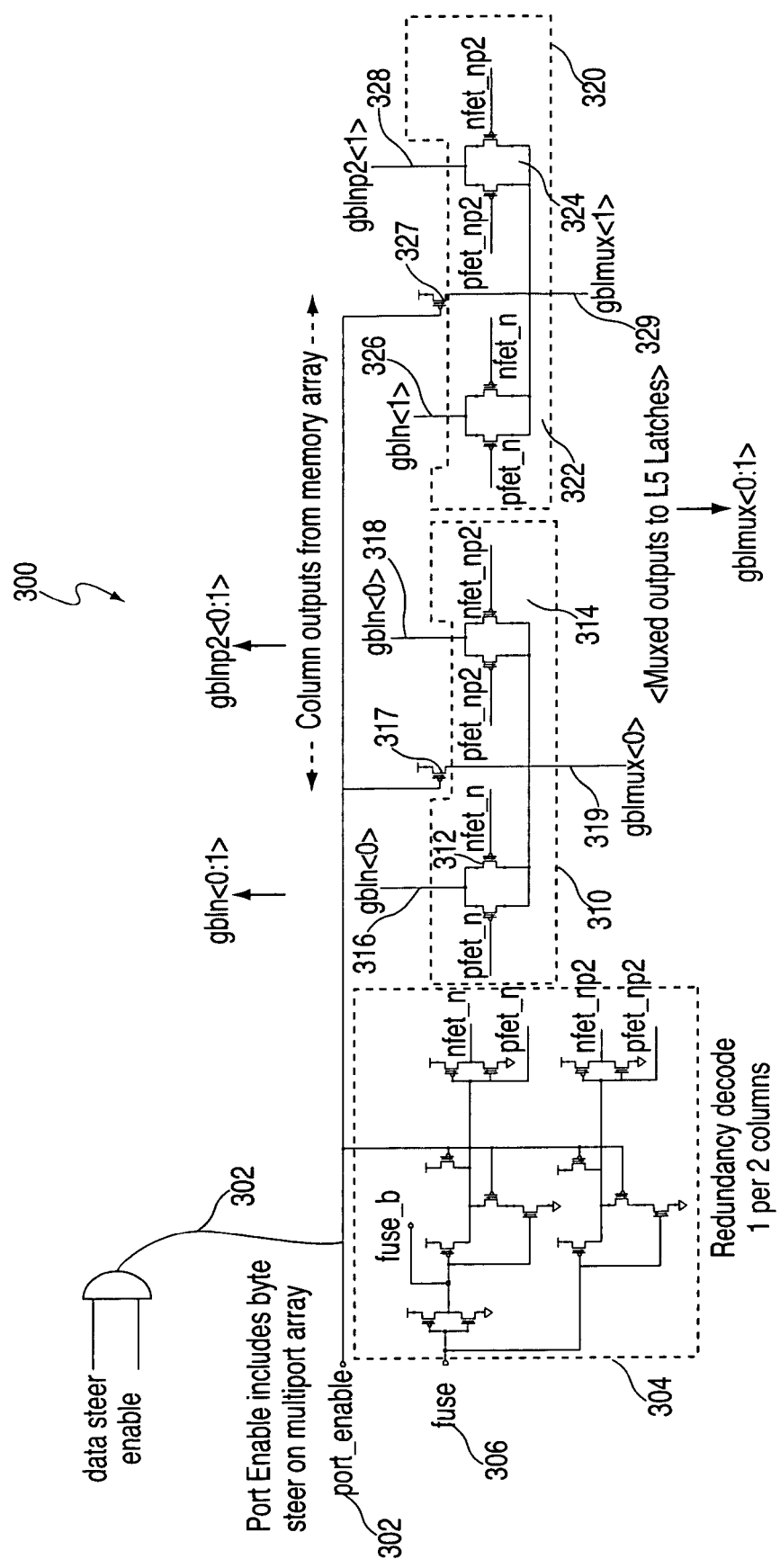
FIG. 3 illustrates an exemplary output timing control circuit.

FIG. 3 illustrates an exemplary output timing control circuit 300. The output timing control circuit 300 merges functions of enable, column redundancy and data steering (if employed) through a single, compact circuit. In an exemplary embodiment, four output timing control circuits 300 are employed to access the memory array under the four access conditions (i.e., top sub-array to port A, top sub-array to port B, bottom sub-array to port A and bottom sub-array to port B).

The column redundancy is controlled by a redundancy decode circuit 304. The redundancy decode circuit 304 performs an AND operation between a port enable signal 302 and a fuse signal 306. When the port enable signal is high, the redundancy decode circuit 304 selects one of two bit column output gates in bit column output circuits 310 and 320 in response to the fuse signal. Thus, the redundancy decode circuit 304 can turn on and off bit column output gates 312 and 322 or turn on and off bit column output gates 314 and 324. The redundancy decode circuit 304 and bit column output circuits 310 and 320 can turn off output from a bit column in the event that a bit column is corrupted. Thus, bit column 316 may be output through bit column output gate 312, bit column 318 output through bit column output gate 314, bit column 326 output through bit column output gate 322 and bit column 328 output through bit column output gate 324. The outputs of bit column output gates 312 and 314 define a first latch output 319. The outputs of bit column output gates 322 and 324 define a second latch output 329. The latch outputs 319 and 329 are fed to latches that hold data from the memory array as known in the art.

The port enable signal 302 activates precharge circuits 317 and 327 (e.g., field effect transistors) that connect the output of bit column output gates 312/314 and 322/324 to a positive voltage. The port enable signal controls the time frame when the bitlines from the memory array are precharged through the precharge circuits 317 and 327.

In order to control the access time of the memory array for gating into output latches, a port enable signal 302 is used to allow data to pass from the cell array to the output latch within a certain timing window. This port enable signal 302 is designed to block early reads (fast cell or write through) which may cause early mode problems and allow a slow cell read to pass to the output latches. The port enable signal is a pulse having a duration sufficient to provide this timing window.

As shown in FIG. 3, the port enable signal is the result of an AND operation with the enable signal and a data steering signal. The data steering signal selects port A or port B. If the memory array is not configured for two port read, then the data steering signal is not used and the port enable signal is based on an enable signal alone to control timing.

The port enable signal 302 is ANDed with a fuse signal in redundancy decode circuit 304. Thus, the port enable signal 302 establishes a timing window when bit column output gates 312/322 or 314/324 are conductive. Furthermore, the port enable signal is connected to the latch outputs 319 and 329 through a FET and serves as a precharge signal for bit lines 316,318,326 and 328.

If the memory array is a multiport array, a data steering signal is used as shown in FIG. 3 and is ANDed with an enable signal to generate the port enable signal 302. If the array is not multiport, then the port enable is signal is equivalent to the enable signal. As noted above, four output timing control circuits 300 are used. Two of the output timing control circuits use the data steer signal and two of the output timing control circuits use the compliment of the data steering signal. When the data steering signal is "1", then two of the output timing control circuits are active. When the data steering signal is "0", then the two other output timing control circuits are active. For example, when the data steer signal is 1, access may be made to the top array at port A and to the bottom array at port B. When the data steer signal is 0, access may be made to the top array at port B and to the bottom array at port A.

Embodiments of the invention provide an output timing control circuit that merges these multiple functions using a port enable signal, fuse signal and data steer signal. For a single port array with similar organization, the data steer signal is not needed. In this case the enable and column redundancy controls are merged. This solution meets the high density requirements for cell pitch column circuitry in SRAM.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An output timing control circuit for use with a memory array, the output timing control circuit comprising:
    a redundancy decode circuit;
    a bit column output circuit including a first bit column output gate and a second bit column output gate, each bit column output gate being coupled to a bitline in the memory array;
    a precharge circuit coupled to an output of the first bit column output gate and the second bit column output gate, the precharge circuit responsive to a port enable signal;
    the redundancy decode circuit receiving the port enable signal and a fuse signal and activating one of the first bit column output gate and the second bit column output gate.

2. The output timing control circuit of claim 1 wherein:
    the redundancy decode circuit performs an AND operation between the port enable signal and the fuse signal.

3. The output timing control circuit of claim 1 further comprising:
    a second bit column output circuit including a third bit column output gate and a fourth bit column output gate, each bit column output gate being coupled to a bitline in the memory array;
    the redundancy decode circuit receiving the port enable signal and a fuse signal and activating one of the third bit column output gate and the fourth bit column output gate.

4. The output timing control circuit of claim 3 wherein:
    the redundancy decode circuit activates the first bit column output gate and the third bit column output gate or activates the second bit column output gate and the fourth bit column output gate.

5. The output timing control circuit of claim 1 wherein:
    the port enable signal establishes a time during which the memory array is accessed.

6. The output timing control circuit of claim 1 wherein:
the memory array is a multiport array, the port enable signal is based on an enable signal and a data steer signal, the data steer signal designating a port and a sub-array of the memory array.

7. The output timing control circuit of claim 6 wherein:
the enable signal and the data steer signal are ANDed.

8. The output timing control circuit of claim 6 wherein:
the multiport array is arranged in a first sub-array and a second sub-array and includes a first port and a second port;
the data steer signal selects at least one of the first sub-array and the first port, the first sub-array and the second port, the second sub-array and the first port and the second sub-array and the second port.

9. The output timing control circuit of claim 6 wherein:
the data steer signal selects the first sub-array and the first port and the second sub-array and the second port; or
the data steer signal selects the first sub-array and the second port and the second sub-array and the first port.

10. A memory comprising:
a memory array having a plurality of cells coupled to bitlines;
an output timing control circuit for use with a memory array, the output timing control circuit including:
a redundancy decode circuit;
a bit column output circuit including a first bit column output gate and a second bit column output gate, each bit column output gate being coupled to a bitline in the memory array;
a precharge circuit coupled to an output of the first bit column output gate and the second bit column output gate, the precharge circuit responsive to a port enable signal;
the redundancy decode circuit receiving the port enable signal and a fuse signal and activating one of the first bit column output gate and the second bit column output gate.

11. The memory of claim 10 wherein:
the redundancy decode circuit performs an AND operation between the port enable signal and the fuse signal.

12. The memory of claim 10 further comprising:
a second bit column output circuit including a third bit column output gate and a fourth bit column output gate, each bit column output gate being coupled to a bitline in the memory array;
the redundancy decode circuit receiving the port enable signal and a fuse signal and activating one of the third bit column output gate and the fourth bit column output gate.

13. The memory of claim 12 wherein:
the redundancy decode circuit activates the first bit column output gate and the third bit column output gate or activates the second bit column output gate and the fourth bit column output gate.

14. The memory of claim 10 wherein:
the port enable signal establishes a time during which the memory array is accessed.

15. The memory of claim 10 wherein:
the memory array is a multiport array, the port enable signal is based on an enable signal and a data steer signal, the data steer signal designating a port and a sub-array of the memory array.

16. The memory of claim 15 wherein:
the enable signal and the data steer signal are ANDed.

17. The memory of claim 15 wherein:
the multiport array is arranged in a first sub-array and a second sub-array and includes a first port and a second port;
the data steer signal selects at least one of the first sub-array and the first port, the first sub-array and the second port, the second sub-array and the first port and the second sub-array and the second port.

18. The memory of claim 15 wherein:
the data steer signal selects the first sub-array and the first port and the second sub-array and the second port; or
the data steer signal selects the first sub-array and the second port and the second sub-array and the first port.

* * * * *